United States Patent [19]

Crosby

[11] 4,335,356
[45] Jun. 15, 1982

[54] PROGRAMMABLE TWO-QUADRANT TRANSCONDUCTANCE AMPLIFIER

[75] Inventor: Philip S. Crosby, Portland, Oreg.

[73] Assignee: Tektronix, Inc., Beaverton, Oreg.

[21] Appl. No.: 113,857

[22] Filed: Jan. 21, 1980

[51] Int. Cl.³ .................... H03F 3/45; H03G 3/30
[52] U.S. Cl. ............................ 330/254; 330/257; 330/288
[58] Field of Search ............ 330/86, 129, 254, 257, 330/279, 282, 288

[56] References Cited

PUBLICATIONS

Edrington, "D-a Converter Forms Programmable Gain Control", *Electronics*, Jul. 24, 1975, p. 92.

*Primary Examiner*—James B. Mullins
*Attorney, Agent, or Firm*—William D. Haffner

[57] ABSTRACT

Two multiplying digital-to-analog converters are used to digitally weight an analog current to produce a controllable output current. The output current is selected by a digital control signal applied to the control inputs of both converters. Two-quadrant operation is ensured by feeding the analog output of each converter to a current mirror amplifier which develops the required output current.

5 Claims, 2 Drawing Figures

PROGRAMMABLE TWO-QUADRANT TRANSCONDUCTANCE AMPLIFIER

BACKGROUND OF THE INVENTION

The present invention relates to digitally-programmable amplifiers, more specifically it relates to digitally-programmable transconductance amplifiers.

Digitally-programmable amplifiers find widespread use throughout the electronics industry. They are used for controlling signal amplitude in programmable waveform generators. They can also be used to generate some particular waveforms such as staircase, ramp or triangular with controllable amplitude and frequency. If a recycling counter is used to drive the amplifier control input, one can generate a parabola represented by its time parametric equation. This basic parabola may then be used to generate other conic sections for graphic displays. Other applications include digital filter control and parametric switching and optimization.

Conventional design techniques produce amplifiers which employ saturating transistor switches and require precise control of offset voltages. The resulting amplifiers respond slowly to control inputs and are difficult to calibrate.

SUMMARY OF THE INVENTION

Two conventional digital-to-analog converters (DAC's) normally used as means for converting from a digital code to an analog current are used to digitally weight an analog signal in order to produce a controllable output current. This circuit performs as a feedback amplifier with a very wide bandwidth. Furthermore, its frequency response is independent of the digitally selected gain.

It is therefore an object of the present invention to provide a digitally-programmable transconductance amplifier.

It is another object of the present invention to provide a digitally-programmable transconductance amplifier operating in two quadrants.

It is a further object of the present invention to provide a digitally-programmable transconductance amplifier in which frequency response does not vary with the programmed gain.

BRIEF DESCRIPTION OF THE DRAWINGS

Various features and advantages of the present invention will become apparent upon consideration of the following description, taken in conjunction with the accompanying drawings wherein.

DESCRIPTION OF THE PREFERRED EMBODIMENT

Figure 1:
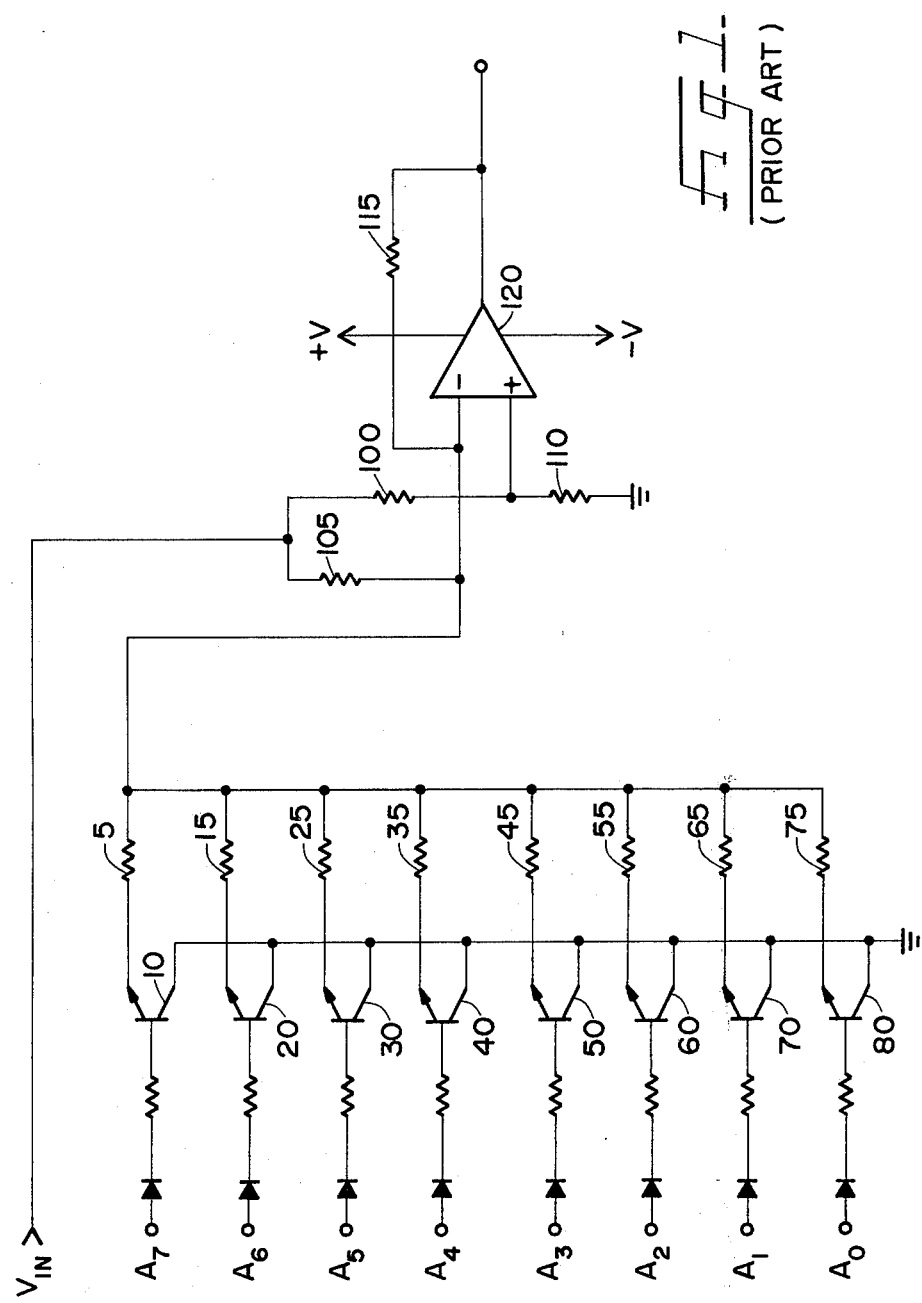
FIG. 1 is a schematic diagram of a prior art digitally-programmable amplifier useful in understanding the advantages of the present invention.

The present invention may be best understood by referring to FIG. 1 which is a prior art digitally controlled amplifier. The transconductance or gain of this amplifier is selectable by an 8-bit digital control signal $A_0$-$A_7$ applied to the bases of switching transistors 10-80.

Half the input signal $V_{in}$ is fed to the non-inverting terminal of amplifier 120 by potential divider 100-110. The inverting terminal is connected to the signal source by a resistance 105, equal to resistance 115, and to ground by a series of eight binary weighted resistors 5-75, through transistor switches 10-80 controlled by an 8-bit digital control signal.

Of prime importance in the design of the amplifier of FIG. 1 is inclusion of an accurate switching system. The switches must have a very low closure voltage and a very low off current. Therefore, a bipolar transistor connected in the inverted manner shown and operated in saturation is utilized as the switch. However, in circuits of this type, the percentage of error in the output signal may exceed 10 percent for input voltages below 10 millivolts. This error is the percentage of deviation from an idealized transfer function. A complete description of the above-described prior art circuit may be found in "Simple digitally-controlled variable-gain linear d.c. amplifier" by A. Sedra and K. C. Smith, *Electronic Engineering*, March 1969, pp. 362-365.

Figure 2:
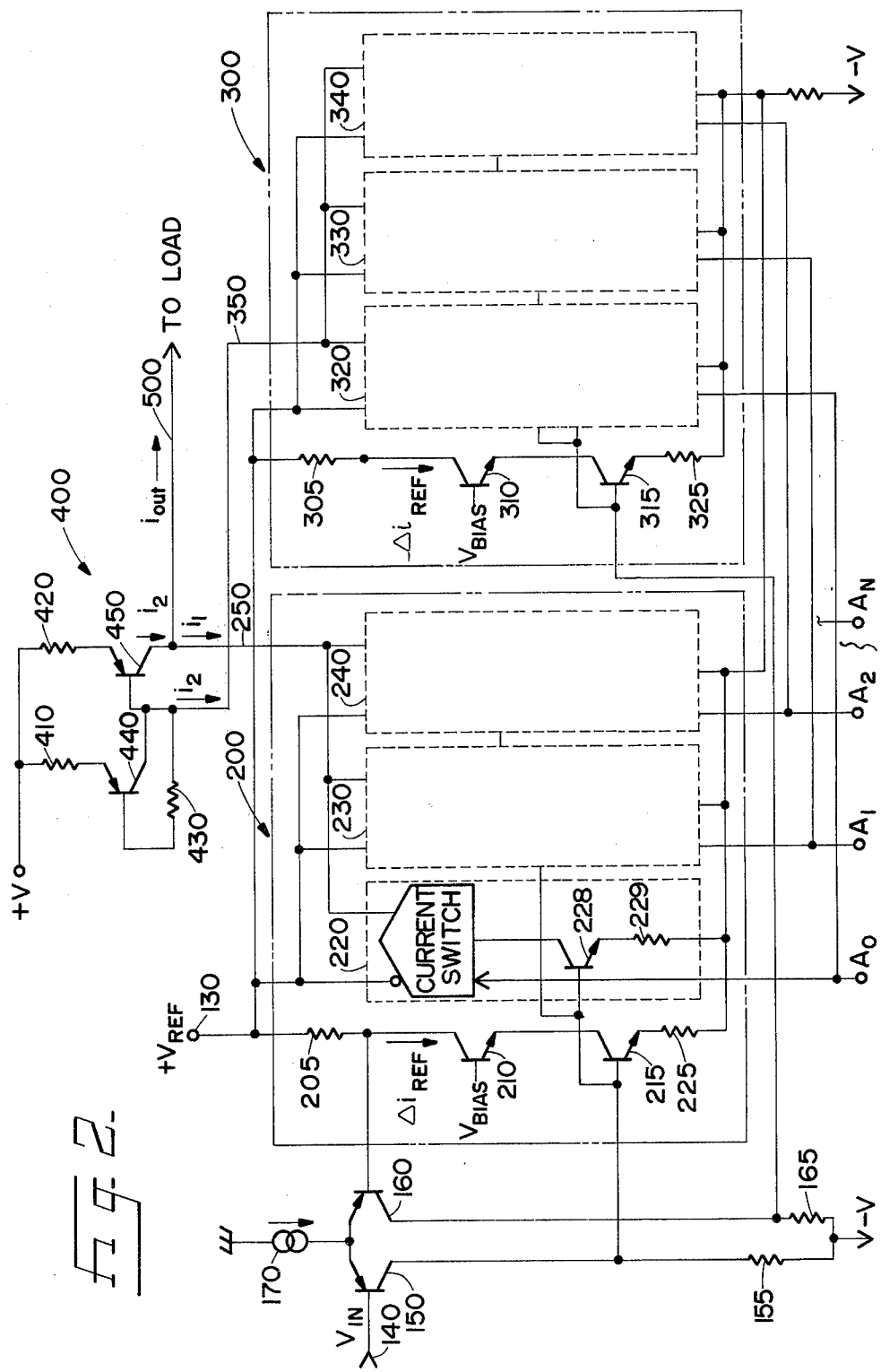
FIG. 2 is a combination schematic and block diagram of an amplifier according to the present invention.

FIG. 2 is a combination block diagram and schematic representative of an amplifier according to the present invention. The input signal to the amplifier, $V_{in}$, is coupled to the base of a PNP transistor 150. The collector of transistor 150 is connected to an appropriate negative potential source through resistance 155. The emitter of transistor 150 is connected to the emitter of PNP transistor 160. The junction of these two emitter electrodes is connected to one terminal of constant current source 170, the other terminal of which is connected to ground. The collector of transistor 160 is connected to an appropriate negative potential source through resistance 165, which is equal to resistance 155. Thus, transistors 150 and 160 are connected as a differential pair. The output terminals of this differential pair, that is, the respective collector electrodes thereof, are each connected to the reference loop of a different multiplying digital-analog-converter (DAC).

DAC's 200 and 300 are represented in a block diagram form meant to be illustrative of conventional multiplying DAC's which utilize switched current sources. DAC's of this kind are well known to those skilled in the art. They produce an analog output current in response to an input digital control signal. There is, of course, one current switch for each bit of the DAC. Depending upon the state of the control inputs ($A_o$-$A_n$), the current switch switches a binary-weighted current to either reference terminal 130 or the output bus. A logical zero causes the current to be switched to terminal 130. Those requiring detailed information on the subject of analog-to-digital conversion are referred to the *Analog-Digital Conversion Handbook*, edited by D. H. Sheingold, copyright 1972 by Analog Devices, Inc.

Within DAC 200, transistors 210 and 215 and resistances 205 and 225 comprise the reference loop. The reference loop simulates elements 220, 230, 240, and so on. Specifically, transistor 210 corresponds to the current switches and transistor 215 and resistance 225 correspond to the binary-weighted current sources. DAC 300 is identical to DAC 200 and elements 305-340 are equivalent to elements 205-240, respectively. Furthermore the control inputs of DAC's 200 and 300 are connected so that they each receive the same digital control signal.

The collector of transistor 150 is connected to the reference loop of DAC 200 and the collector of transistor 160 is connected to the reference loop of DAC 300. Terminal 130 is connected to a suitable source of a stable dc reference potential designated $V_{REF}$ and to both reference loops.

Output bus 250 of DAC 200 and output bus 350 of DAC 300 are each connected to current mirror amplifier 400 which allows the amplifier to operate in two quadrants. The term "current mirror amplifier" refers to transistor amplifiers having a current-gain substantially independent of the individual common-emitter forward current gains of their transistors. Conventionally, this is done by relying upon the proportion between the transconductances of a first and second transistor. The first and second transistors are arranged with their emitter electrodes connected to a common terminal of the current mirror amplifier, their collector electrodes respectively connected to the input terminal and the output terminals of the current mirror amplifier, and the base electrodes similarly connected each to the collector electrode of the first transistor. The first transistor is provided with direct-coupled collector-to-base feedback by the connection of its collector and base electrodes, which adjusts its base-emitter potential to condition the first transistor to conduct as its collector current substantially the entire input current of the current mirror amplifier. Because of the similar base-emitter potentials of the first and second transistors, the collector current of the second transistor flowing through the output terminal of the current mirror amplifier is related to the input current in the same ratio as the transconductance of the second transistor is related to the first.

Current mirror 400 is an improvement over the above-described circuit. Such circuit is disclosed in U.S. Pat. No. 3,939,434, Wideband DC Current Amplifer, issued Feb. 17, 1976, which is herein incorporated by reference.

The input signal enters the amplifier on input line 140 which is connected to the input differential pair 150–160. The polarity of the signal appearing across resistance 155 is opposite to the polarity of the input signal. This signal is coupled to the base of transistor 160 (the other half of the input differential pair) via a negative feedback arrangement involving resistance 225, transistor 215, transistor 210 and resistance 205. The current in the reference loop of DAC 200 may be expressed as:

$$i_{REF} = \frac{V_{REF} - V_{IN}}{R} \quad (1)$$

where R = the value of resistance 205.

A push-pull current is thus created through the reference loops of DAC 200 and DAC 300. Since these DAC's are identical and resistance 205 variations in is equal to resistance 305, the reference currents are equal and opposite. Therefore, the current change through the reference loop of DAC 300 is:

$$\Delta i_{REF} = -(\Delta i_{REF}) \quad (2)$$

The current through the current switch for each bit of DAC's 200 and 300 is either a multiple of the respective reference current or zero. In other words, if the voltage at the control input is a logical one, the current through the switch is the reference current multiplied by the binary weight of the bit. If the voltage at the control input is a logical zero, the current through switch is zero. The DAC output currents may be expressed as:

$$i_1 = i_{REF}KP \quad (3)$$

$$i_2 = i_{REF}KP \quad (4)$$

where K is a constant representing the step variation in gain and P is the decimal equivalent of the digital control signal. For an n-bit binary signal, P is given by $$P = 2^0 A_0 + 2^1 A_1 + 2^2 A_2 \rightleftarrows \ldots 2^{n-1} A_{n-1} \quad (5)$$

Thus, the transfer function of the amplifier is selected by the digital control signal applied to inputs $A_0$–$A_n$. Two-quadrant operation is provided by the current mirror action of transistors 440 and 450 as described in the previously mentioned U.S. Pat. No. 3,939,434. The output current on line 500 is:

$$i_{OUT} = i_2 - i_1 \quad (6)$$

If desired, the output current, $i_{OUT}$, may be converted to a voltage by one of the many conventional means. For example, a voltage may be developed across a load resistor or at the summing node of an operational amplifier connected in a feedback configuration. The resulting circuit then produces a programmable output voltage.

It may be observed in the foregoing specification that such specification is not burdened by the inclusion of large amounts of detail and specific information relative to such matters as biasing and the like since all such information is well within the skill of the art. It should also be noted that the particular embodiment of the invention which is shown and described herein is intended as merely illustrative and not as restrictive of the invention. Therefore, the appended claims are intended to cover all modifications to the invention which fall within the scope of the foregoing specification.

I claim as my invention:

1. A controllable gain amplifier, comprising
   input means responsive to an input signal for providing phase-opposed first and second signals,
   current amplifying means for producing at an output thereof a current substantially equal in magnitude to that provided at an input thereof,
   a first multiplying digital-to-analog converter having (a) an input coupled to receive said first signal, (b) an output coupled to the input of said current amplifying means, and (c) a plurality of control signal terminals,
   a second multiplying digital-to-analog converter having (a) an input coupled to receive said second signal, (b) an output coupled to the output of said current amplifying means, and (c) a plurality of control signal terminals, each one connected in parallel with a corresponding control terminal of said first converter, and
   output means coupled to the output of said current amplifying means for providing an output signal at a gain determined by a signal applied to said control terminals.

2. A controllable gain amplifier, comprising in operative combination
   input means responsive to an input signal for providing phase-opposed first and second signals,
   current amplifying means for producing at an output thereof a current substantially equal in magnitude to that provided at an input thereof, first circuit means including (a) a first input coupled to receive said first signal, (b) a first output coupled to the input of said current amplifying means, (c) a plurality of digital logic control signal input terminals, and (d) current switching means for providing at said first output different discrete current levels in response to the application of different digital logic signals to said control terminals, second circuit means including (a) a second input coupled to receive said second signal, (b) a second output coupled to the output of said current amplifying means, (c) a plurality of digital logic control signal input terminals, each one connected in parallel with a corresponding control terminal of said first circuit means, and (d) current switching means for providing at said second output different discrete current levels in response to the application of said different digital logic signals to said control terminals, and output means coupled to the output of said current amplifying means for providing an output signal at a gain determined by a digital logic signal applied to said control terminals.

3. The amplifier of claim 2, wherein each of said first and second circuit means consists of a multiplying digital-to-analog converter.

4. The amplifier of claim 2, wherein said input means comprises a pair of transistors connected to provide a differential output.

5. The amplifier of claim 2, wherein said current amplifying means comprises first and second transistors connected such that current flow through the first transistor is mirrored in the second transistor.

* * * * *

UNITED STATES PATENT AND TRADEMARK OFFICE
CERTIFICATE OF CORRECTION

PATENT NO. : 4,335,356

DATED : June 15, 1982

INVENTOR(S) : Philip S. Crosby

It is certified that error appears in the above—identified patent and that said Letters Patent is hereby corrected as shown below:

Col. 3, lines 54-55, reads "205 variations in is" it should be --205 is equal to resistance 305, variations in--

Col. 4, line 10 reads:

$$\text{"P} = 2^0{}_{A0} + 2^1{}_{A1} + 2^2{}_{A2} \rightleftarrows \ldots 2^{n-1}{}_{An-1}\text{"}$$

should read:

$$\text{--P} = 2^0{}_{A0} + 2^1{}_{A1} + 2^2{}_{A2} + \ldots 2^{n-1}{}_{An-1}\text{--}.$$

Signed and Sealed this

Seventeenth Day of August 1982

[SEAL]

Attest:

GERALD J. MOSSINGHOFF

Attesting Officer    Commissioner of Patents and Trademarks